(12) United States Patent
Kong et al.

(10) Patent No.: US 10,620,354 B2
(45) Date of Patent: Apr. 14, 2020

(54) PHASE DIFFERENCE FILM AND DISPLAY DEVICE

(71) Applicant: SAMSUNG ELECTRONICS CO., LTD., Suwon-si, Gyeonggi-do (KR)

(72) Inventors: Hye Young Kong, Uijeongbu-si (KR); Hyunseok Choi, Anyang-si (KR); Sangah Gam, Seoul (KR)

(73) Assignees: SAMSUNG ELECTRONICS CO., LTD., Gyeonggi-Do (KR); SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/101,893

(22) Filed: Aug. 13, 2018

(65) Prior Publication Data
US 2019/0250319 A1 Aug. 15, 2019

(30) Foreign Application Priority Data

Feb. 12, 2018 (KR) .................. 10-2018-0017270

(51) Int. Cl.
*G02F 1/1335* (2006.01)
*G02B 5/30* (2006.01)
(Continued)

(52) U.S. Cl.
CPC ............. *G02B 5/3083* (2013.01); *G02B 1/04* (2013.01); *G02F 1/133528* (2013.01);
(Continued)

(58) Field of Classification Search
CPC .... G02B 5/3083; G02B 5/305; G02B 5/0841; G02B 1/04; G02B 1/111; G02F 1/1335;
(Continued)

(56) References Cited

U.S. PATENT DOCUMENTS

| 749,468 A | 1/1904 | Wilkinson |
| 7,586,571 B2 | 9/2009 | Yoshimi et al. |

(Continued)

FOREIGN PATENT DOCUMENTS

| JP | 06-194667 A | 7/1994 |
| JP | 3620839 B2 | 11/2004 |

(Continued)

OTHER PUBLICATIONS

European Search Report for European Patent Application No. 18209128.0 dated Jun. 21, 2019.

*Primary Examiner* — Thoi V Duong
(74) *Attorney, Agent, or Firm* — Cantor Colburn LLP

(57) ABSTRACT

A phase difference film including: a phase difference thin film including at least two non-liquid crystal polymers, wherein the phase difference thin film satisfies refractive indexes of $n_x \geq n_y > n_z$ and has a thickness direction phase difference per unit thickness of greater than or equal to about 80 nm/μm, wherein $n_x$ denotes a refractive index of the phase difference thin film at a slow axis thereof, $n_y$ denotes a refractive index of the phase difference thin film at a fast axis thereof, and $n_z$ denotes a refractive index of the phase difference thin film in a direction perpendicular to the slow axis and the fast axis thereof, and wherein an average light transmittance in a wavelength region of about 360 nm to about 740 nm is greater than or equal to about 88%, and a display device including the same.

20 Claims, 2 Drawing Sheets

(51) Int. Cl.
*G02F 1/13357* (2006.01)
*G02F 1/13363* (2006.01)
*G02B 1/04* (2006.01)
*H01L 51/52* (2006.01)

(52) U.S. Cl.
CPC .. *G02F 1/133617* (2013.01); *G02F 1/133632* (2013.01); *G02F 1/133634* (2013.01); *H01L 51/5275* (2013.01); *G02F 2001/133565* (2013.01)

(58) Field of Classification Search
CPC ............. G02F 1/133528; G02F 1/1336; G02F 1/13363; G02F 1/133632; G02F 1/133634; G02F 1/133602; G02F 1/133514; G02F 1/133615; G02F 1/133617; G02F 1/133711; G02F 1/136; G02F 1/1368; G02F 2001/133565; G02F 2001/133638; G02F 2001/133635; G02F 2202/022; G02F 2413/11; G02F 2413/13; G02F 2413/14; G02F 2413/12; B32B 2457/20; B32B 2457/206; B32B 27/34; B32B 2250/24; B32B 15/088; B32B 2379/08; C08J 2379/08; H01L 51/5275
See application file for complete search history.

(56) References Cited

U.S. PATENT DOCUMENTS

| | | | |
|---|---|---|---|
| 8,125,596 B2 * | 2/2012 | Murakami | G02B 5/3083 349/117 |
| 8,264,638 B2 | 9/2012 | Jung et al. | |
| 9,670,352 B2 | 6/2017 | Chun et al. | |
| 2006/0192913 A1 | 8/2006 | Shutou et al. | |
| 2008/0198304 A1 * | 8/2008 | Oka | G02F 1/133555 349/96 |
| 2010/0045910 A1 | 2/2010 | Bitou et al. | |
| 2013/0202869 A1 | 8/2013 | Cho et al. | |
| 2017/0081478 A1 | 3/2017 | Jeon et al. | |

FOREIGN PATENT DOCUMENTS

| | | |
|---|---|---|
| JP | 2006-018323 A | 1/2006 |
| JP | 2007-193045 A | 8/2007 |
| JP | 2008-171007 A | 7/2008 |
| JP | 2008-233654 A | 10/2008 |
| JP | 2014-182283 A | 9/2014 |
| KR | 2005-0065053 A | 6/2005 |
| KR | 2006-0192913 A1 | 8/2006 |
| KR | 1361561 B1 | 2/2014 |

* cited by examiner

PHASE DIFFERENCE FILM AND DISPLAY DEVICE

CROSS-REFERENCE TO RELATED APPLICATION

This application claims priority to Korean Patent Application No. 10-2018-0017270 filed in the Korean Intellectual Property Office on Feb. 12, 2018, and all the benefits accruing therefrom under 35 U.S.C. § 119, the entire contents of which are incorporated herein in its entirety by reference.

BACKGROUND

1. Field

A phase difference film and a display device are disclosed.

2. Description of the Related Art

Flat panel displays may be classified into a light-emitting display device emitting light by itself and a non-emissive display device requiring a separate light source, and a phase difference film is frequently employed for improving the image quality thereof. The phase difference film may realize, for example, a predetermined phase difference by elongating a polymer film in a uniaxial or biaxial direction.

Recently, research efforts on a coating-type phase difference film instead of an elongated polymer film have been conducted. Since the coating-type phase difference film is formed by coating a solution on a substrate, the process may be easy and a film having a low thickness may be realized. However, it is difficult for the coating-type phase difference film to have a low thickness and simultaneously satisfy a desired phase difference and light transmittance.

Thus, there remains a need in a phase difference film having a low thickness and simultaneously satisfying a desired phase difference and light transmittance.

SUMMARY

An embodiment provides a phase difference film having a low thickness and simultaneously satisfying a desired phase difference and light transmittance.

Another embodiment provides a display device that includes the phase difference film.

Yet another embodiment provides a liquid crystal display (LCD) including the phase difference film as an in-cell film.

According to an embodiment, a phase difference film includes a phase difference thin film including at least two non-liquid crystal polymers, wherein the phase difference thin film satisfies refractive indexes of $n_x \geq n_y > n_z$ and has a thickness direction phase difference per unit thickness of greater than or equal to about 80 nanometers/micrometer, wherein $n_x$ denotes a refractive index of the phase difference thin film at a slow axis thereof, $n_y$ denotes a refractive index of the phase difference thin film at a fast axis thereof, and $n_z$ denotes a refractive index of the phase difference thin film in a direction perpendicular to the slow axis and the fast axis thereof, and wherein an average light transmittance in a wavelength region of about 360 nanometers to about 740 nanometers is greater than or equal to about 88%.

Each of the non-liquid crystal polymers may have a glass transition temperature of greater than or equal to about 150° C.

One of the non-liquid crystal polymers may be a polyamideimide.

The other of the non-liquid crystal polymers may be a polyimide.

An amount of the polyamideimide may be the same as or greater than an amount of the polyimide.

An amount of the polyamideimide may be about 50 percent by weight to about 75 percent by weight %, based on a total amount of the polyimide and the polyamideimide.

The refractive indexes of the phase difference thin film may satisfy $n_x = n_y > n_z$.

The thickness direction phase difference per unit thickness of the phase difference thin film may range from about 80 nanometers/micrometer to about 120 nanometers/micrometer.

A thickness of the phase difference thin film may be less than or equal to about 5 micrometers.

The optical film may consist of the phase difference thin film, and the phase difference thin film may be a non-elongated thin film.

The phase difference film may have a yellow index (YI) of less than or equal to about 1.0 and a haze of less than or equal to about 0.3.

According to another embodiment, a display device may include the phase difference film.

According to another embodiment, a liquid crystal display (LCD) includes:

a light source and a liquid crystal display panel, wherein the liquid crystal display panel includes:

a first substrate disposed at the side of the light source, a second substrate facing the first substrate, a liquid crystal layer disposed between the first substrate and the second substrate, and a phase difference thin film disposed between the second substrate and the liquid crystal layer, wherein the phase difference thin film includes at least two non-liquid crystal polymers, wherein the phase difference thin film satisfies refractive indexes of $n_x \geq n_y > n_z$ and has a thickness direction phase difference per unit thickness of greater than or equal to about 80 nanometers/micrometer, wherein $n_x$ denotes a refractive index of the phase difference thin film at a slow axis thereof, $n_y$ denotes a refractive index of the phase difference thin film at a fast axis thereof, and $n_z$ denotes a refractive index of the phase difference thin film in a direction perpendicular to the slow axis and the fast axis thereof, and wherein the phase difference thin film has an average light transmittance of greater than or equal to about 88% in a wavelength region of about 360 nanometers to about 740 nanometers.

Each of the non-liquid crystal polymers may have a glass transition temperature of greater than or equal to about 150° C.

One of the non-liquid crystal polymers may be a polyamideimide.

The other of the non-liquid crystal polymers may be a polyimide.

An amount of the polyamideimide may be the same as or greater than an amount of the polyimide.

An amount of the polyamideimide may be about 50 percent by weight to about 75 percent by weight, based on a total amount of the polyimide and the polyamideimide.

The refractive indexes of the phase difference thin film may satisfy $n_x = n_y > n_z$.

The thickness direction phase difference per unit thickness of the phase difference thin film may range from about 80 nanometers/micrometer to about 120 nanometers/micrometer.

A thickness of the phase difference thin film may be less than or equal to about 5 micrometers.

The liquid crystal display (LCD) may further include a polarization layer disposed on one surface of the phase difference thin film between the second substrate and the liquid crystal layer.

The liquid crystal display (LCD) may further include a color conversion layer disposed on an upper surface of the phase difference thin film, and the color conversion layer may include a light emitting element that is supplied with first visible light from the light source, wherein the light emitting element emits second visible light of the same wavelength as the first visible light or a longer wavelength than the first visible light.

A phase difference film having a low thickness and simultaneously satisfying a phase difference and light transmittance may be provided. This phase difference film may be included in a display device, and thus, improve display characteristics of the display device.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
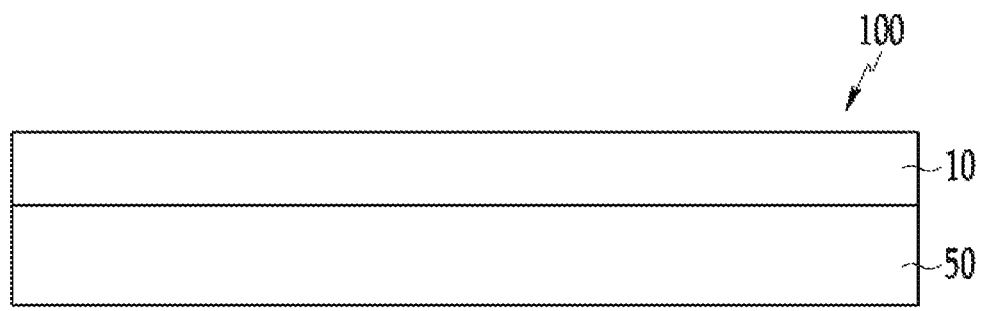
FIG. 1 is a schematic cross-sectional view of a display device according to an embodiment.

Hereinafter, embodiments will hereinafter be described in detail so that a person skilled in the art would understand them. However, embodiments may be embodied in many different forms and is not construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, 'substituted' refers to replacement of hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, a phase difference film according to an embodiment is described.

The phase difference film according to an embodiment may include a coating-type phase difference thin film coated through a solution process, and the coating-type phase difference thin film may be, for example, a non-elongated thin film.

The phase difference thin film may have a low thickness of less than or equal to about 5 micrometers (μm), for example, less than or equal to about 4.5 μm, less than or equal to about 4.2 μm, less than or equal to about 4.0 μm, less than or equal to about 3.8 μm, less than or equal to about 3.5 μm, less than or equal to about 3.3 μm, less than or equal to about 3.2 μm, or less than or equal to about 3.0 μm.

The phase difference thin film may, for example, satisfy a refractive index of Relationship Formula 1.

$$n_x \geq n_y > n_z \qquad \text{Relationship Formula 1}$$

In Relationship Formula 1, $n_x$ denotes a refractive index of the phase difference thin film in a direction having the highest in-plane refractive index (hereinafter, referred to as a 'slow axis'), $n_y$ denotes a refractive index of the phase difference thin film in a direction having the lowest in-plane refractive index (hereinafter, referred to as a 'fast axis'), and $n_z$ denotes a refractive index of the phase difference thin film in a direction perpendicular to the slow axis and the fast axis.

The phase difference thin film may perform a compensation function to reduce viewing angle dependency due to the refractive index of Relationship Formula 1 more effectively.

For example, the phase difference thin film may, for example, satisfy a refractive index of Relationship Formula 1a.

$$n_x = n_y > n_z \qquad \text{Relationship Formula 1a}$$

In Relationship Formula 1a, $n_x$ and $n_y$ may be substantially equivalent as well as completely the same and regarded as substantially equivalent when the difference of refractive indexes between $n_x$ and $n_y$ less than or equal to about 10 nanometers (nm), for example, less than or equal to about 5 nm. By satisfying Relationship Formula 1a, it may have a substantial in-plane isotropy.

The phase difference thin film may circularly-polarize incidence light to generate a phase difference. The phase difference may be expressed as an in-plane phase difference ($R_e$) and a thickness direction phase difference ($R_{th}$). While not wishing to be bound by any particular theory, it is understood that, because the phase difference thin film has a low thickness of less than or equal to about 5 μm, it may satisfy a phase difference per a predetermined unit thickness so as to effectively perform a compensation function.

The thickness direction phase difference ($R_{th}/d$) of the phase difference thin film is a phase difference per unit thickness of 1 μm which is generated in a thickness direction of the phase difference thin film and may be expressed as $R_{th}/d = [(n_x + n_y)/2] - n_z$. Herein, $n_x$ denotes a refractive index of the phase difference thin film at a slow axis thereof, $n_y$ denotes a refractive index of the phase difference thin film at a fast axis thereof, $n_z$ denotes a refractive index of the phase difference thin film in a direction perpendicular to the slow axis and the fast axis thereof, and d denotes a thickness of the phase difference thin film.

The phase difference thin film may have a thickness direction phase difference per unit thickness of greater than or equal to about 80 nanometers per micrometer (nm/μm). The phase difference thin film may have a thickness direction phase difference per unit thickness of about 80 nm/μm to about 300 nm/μm, for example, about 80 nm/μm to about 250 nm/μm, about 80 nm/μm to about 230 nm/μm, about 80 nm/μm to about 220 nm/μm, about 80 nm/μm to about 200 nm/μm, about 80 nm/μm to about 180 nm/μm, about 80 nm/μm to about 150 nm/μm, or about 80 nm/μm to about 120 nm/μm. While not wishing to be bound by any particular theory, it is understood that, when the thickness direction phase difference per unit thickness is within the above ranges, the phase difference thin film having a low thickness performs an effective compensation function.

The phase difference thin film may include at least two non-liquid crystal polymers, and a combination thereof may exhibit the optical properties described above.

The non-liquid crystal polymers may include a heat resistance polymer. The heat resistance polymer may have, for example, a glass transition temperature of greater than or equal to about 150° C. ($T_g$), for example, a glass transition temperature of greater than or equal to about 180° C., a glass transition temperature of greater than or equal to about 200° C., a glass transition temperature of greater than or equal to about 220° C., or a glass transition temperature of greater than or equal to about 230° C.

For example, the phase difference thin film may include two non-liquid crystal polymers, and one of the two non-liquid crystal polymers may be a polyamideimide.

For example, the phase difference thin film may include two non-liquid crystal polymers, and one of the two non-liquid crystal polymers may be a polyimide.

For example, the phase difference thin film may include two non-liquid crystal polymers, and one of the two non-liquid crystal polymers may be a polyimide and the other may be a polyamideimide.

For example, the phase difference thin film may include a mixture of polyimide and polyamideimide.

The polyimide may have an imide structural unit in the structure, for example, a structural unit represented by Chemical Formula 1.

Chemical Formula 1

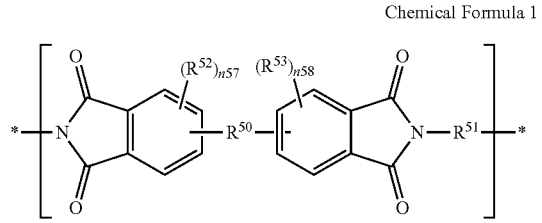

In Chemical Formula 1, $R^{50}$ are the same or different in each repeating unit and are independently a single bond, a substituted or unsubstituted C1 to C30 aliphatic organic group, a substituted or unsubstituted C3 to C30 alicyclic organic group, a substituted or unsubstituted C6 to C30 aromatic organic group, a substituted or unsubstituted C2 to C30 hetero cyclic group, or a combination thereof, $R^{51}$ are the same or different in each repeating unit and independently include a substituted or unsubstituted C6 to C30 aromatic organic group, wherein the aromatic organic group may be present alone; two or more aromatic organic groups are fused to provide a condensed ring; or two or more aromatic organic groups are linked through a single bond, a substituted or unsubstituted fluorenyl group, O, S, C(=O), CH(OH), S(=O)$_2$, Si(CH$_3$)$_2$, (CH$_2$)$_{p1}$ (wherein, 1≤p1≤10), (CF$_2$)$_{q1}$ (wherein, 1≤q1≤10) C(CH$_3$)$_2$, C(CF$_3$)$_2$, or C(=O)NH, $R^{52}$ and $R^{53}$ are independently substituted or unsubstituted C1 to C30 alkyl group, a substituted or unsubstituted C3 to C30 cycloalkyl group, a substituted or unsubstituted C1 to C30 alkoxy group, a substituted or unsubstituted C6 to C30 aryl group, a substituted or unsubstituted C3 to C30 heterocyclic group, halogen, a hydroxy group, a substituted or unsubstituted silyl group, or a combination thereof, and n57 and n58 are independently an integer of 0 to 3.

For example, the structural unit represented by Chemical Formula 1 may include a structural unit represented by Chemical Formula 1a, a structural unit represented by Chemical Formula 1 b, or a combination thereof, but is not limited thereto.

Chemical Formula 1a

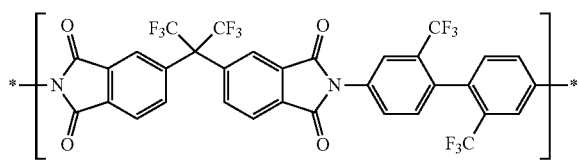

Chemical Formula 1b

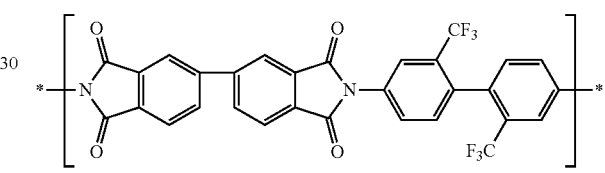

For example, the polyimide may have a weight average molecular weight of about 10,000 Daltons (Da) to about 200,000 Da, for example, about 25,000 Da to about 200,000 Da, for example, about 50,000 Da to about 200,000 Da, for example, about 75,000 Da to about 200,000 Da, or for example, about 100,000 Da to about 200,000 Da.

The polyimide may be, for example, obtained by reacting anhydride and a diamine compound. For example, the anhydride may be tetracarboxylic acid dianhydride and the tetracarboxylic acid dianhydride may be, for example, 3,3',4,4'-biphenyltetracarboxylic dianhydride (BPDA), 4,4'-(hexafluoroisopropylidene)diphthalic anhydride (6FDA), or a combination thereof, and the diamine compound may be, for example, 2,2'-bis(trifluoromethyl)benzidine (TFDB).

The polyamideimide may have an amide structural unit and an imide structural unit in the structure, and may include, for example, a structural unit represented by Chemical Formula 2 and a structural unit represented by Chemical Formula 3.

Chemical Formula 2

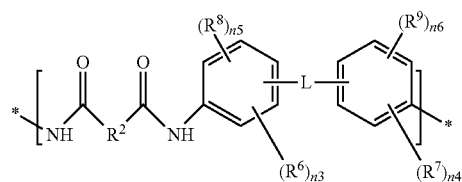

In Chemical Formula 2,

L is a single bond, —CONH—, -Ph-CONH-Ph-, or —NHCO-Ph-CONH—, wherein "Ph" is a substituted or unsubstituted phenylene ($C_6H_4$), $R^2$ is a divalent organic group including a substituted or unsubstituted one or two or more C6 to C30 aromatic rings, wherein two or more aromatic rings are bound to each other to form a fused ring or two or more aromatic rings are linked to each other through a single bond, O, S, $S(=O)_2$, C=O, C(=O)NH, $CR^a(OH)$, $SiR^bR^c$, or $(CR^dR^e)_{p2}$ (wherein $1 \leq p2 \leq 10$) wherein $R^a$ to $R^e$ are independently hydrogen or a substituted or unsubstituted C1 to C30 alkyl group, $R^6$ and $R^7$ are independently an electron withdrawing group, for example, —$CH_2F$, —$CHF_2$, —$CF_3$, —$CH_2Cl$, —$CHCl_2$, —$CCl_3$, —$CH_2Br$, —$CHBr_2$, —$CBr_3$, —$CH_2I$, —$CHI_2$, —$Cl_3$, —$NO_2$, —CN, —$COCH_3$, or —$CO_2C_2H_5$, $R^8$ and $R^9$ are independently a substituted or unsubstituted C1 to C30 alkyl group, a substituted or unsubstituted C3 to C30 cycloalkyl group, a substituted or unsubstituted C1 to C30 alkoxy group, a substituted or unsubstituted C6 to C30 aryl group, a substituted or unsubstituted C3 to C30 heterocyclic group, halogen, a hydroxy group, a substituted or unsubstituted silyl group, or a combination thereof, n3 is an integer of 0 to 4, n5 is an integer of 0 to 3, n3+n5 is an integer of 0 to 4, n4 is an integer of 0 to 4, n6 is an integer of 0 to 3, and n4+n6 is an integer of 0 to 4, Chemical Formula 3

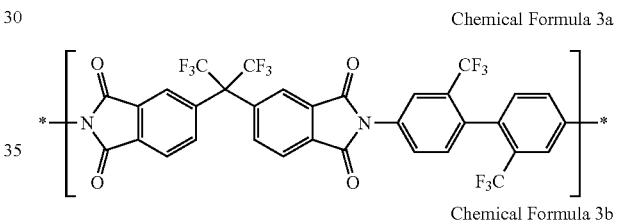

wherein, in Chemical Formula 3, $R^{10}$ are the same or different in each repeating unit and are independently a single bond, a substituted or unsubstituted C1 to C30 aliphatic organic group, a substituted or unsubstituted C3 to C30 alicyclic organic group, a substituted or unsubstituted C6 to C30 aromatic organic group, a substituted or unsubstituted C2 to C30 hetero cyclic group, or a combination thereof, $R^{11}$ are the same or different in each repeating unit and independently include a substituted or unsubstituted C6 to C30 aromatic organic group, wherein the aromatic organic group may be present alone; two or more aromatic organic groups are fused to provide a condensed ring; or two or more aromatic organic groups are linked through a single bond, a substituted or unsubstituted fluorenyl group, O, S, C(=O), CH(OH), $S(=O)_2$, $Si(CH_3)_2$, $(CH_2)_{p3}$ (wherein $1 \leq p3 \leq 10$), $(CF_2)_{q3}$ (wherein $1 \leq p3 \leq 10$), $C(CH_3)_2$, $C(CF_3)_2$, or C(=O)NH, $R^{12}$ and $R^{13}$ are independently substituted or unsubstituted C1 to C30 alkyl group, a substituted or unsubstituted C3 to C30 cycloalkyl group, a substituted or unsubstituted C1 to C30 alkoxy group, a substituted or unsubstituted C6 to C30 aryl group, a substituted or unsubstituted C3 to C30 heterocyclic group, halogen, a hydroxy group, a substituted or unsubstituted silyl group, or a combination thereof, and n7 and n8 are independently an integer of 0 to 3.

For example, the structural unit represented by Chemical Formula 2 may include a structural unit represented by Chemical Formula 2a, a structural unit represented by Chemical Formula 2b, or a combination thereof, but is not limited thereto.

Chemical Formula 2a

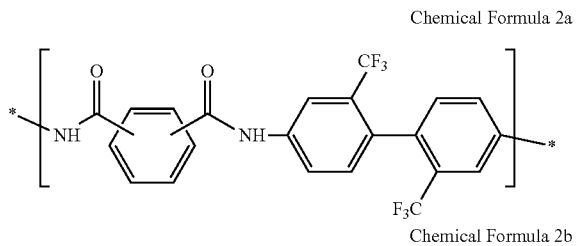

Chemical Formula 2b

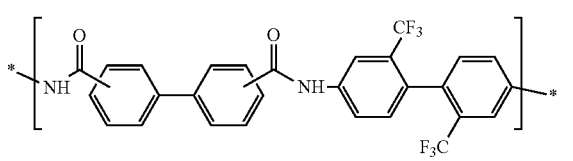

For example, the structural unit represented by Chemical Formula 3 may include a structural unit represented by Chemical Formula 3a, a structural unit represented by Chemical Formula 3b, or a combination thereof, but is not limited thereto.

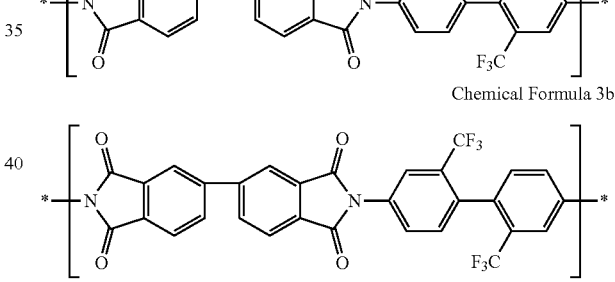

For example, the polyamideimide may include the structural unit represented by Chemical Formula 2 and the structural unit represented by Chemical Formula 3 in a molar ratio of about 90:10 to about 10:90. Within these ranges, for example, the structural unit represented by Chemical Formula 2 and the structural unit represented by Chemical Formula 3 may be included in a ratio of about 70:30 to about 30:70, or about 60:40 to about 40:60.

For example, the polyamideimide may have a weight average molecular weight of about 50,000 Da to about 200,000 Da, for example, about 75,000 Da to about 200,000 Da, or for example, about 100,000 Da to about 200,000 Da.

The polyamideimide may be, for example, obtained by reacting an anhydride, a diamine compound, and a dicarboxylic acid derivative. For example, the anhydride may be tetracarboxylic acid dianhydride and the tetracarboxylic acid dianhydride may be, for example, 3,3',4,4'-biphenyltetracarboxylic dianhydride (BPDA), 4,4'-(hexafluoroisopropylidene)diphthalic anhydride (6FDA), or a combination thereof, the diamine compound may be, for example, 2,2'-bis(trifluoromethyl)benzidine (TFDB), and the dicarboxylic acid derivative may be, for example, 4,4'-biphenyl dicarbonyl chloride (BPCL), terephthaloyl chloride (TPCL), or a combination thereof.

For example, the polyamideimide may be obtained by supplying about 0.1 mol to about 0.7 mol of the tetracarboxylic acid dianhydride and about 0.3 mol to about 0.9 mol of the dicarboxylic acid derivative relative to 1 mol of the diamine compound.

For example, the polyamideimide may be obtained by forming an amide structural unit through a reaction of a dicarboxylic acid derivative with a diamine compound, and subsequently adding a tetracarboxylic acid dianhydride thereto to react them and to link the amide structural unit with the amic acid structural unit.

For example, the polyamideimide may be obtained by preparing an oligomer (hereinafter, referred to as 'amide group-containing oligomer') including an amide group and amino groups at both terminal ends through a reaction of a dicarboxylic acid derivative and a diamine compound, and reacting the amide group-containing oligomer as a diamine compound with a tetracarboxylic acid dianhydride.

For example, the phase difference thin film may include a mixture of polyimide and polyamideimide and the polyamideimide may be included in the same amount as or greater amount than the polyamide. For example, the polyamideimide may be included in an amount of about 50 percent by weight (wt %) to about 75 wt %, for example, about 55 wt % to about 75 wt %, for example, about 60 wt % to about 75 wt %, or about 65 wt % to about 75 wt %, based on a total amount of the polyimide and the polyamideimide. While not wishing to be bound by any particular theory, it is understood that, when the polyamideimide is included within the above ranges, a phase difference film may have sufficient transmittance characteristics as well as the above refractive index and phase retardation.

For example, the phase difference film may satisfy an average light transmittance of greater than or equal to about 88% in a wavelength region of about 360 nm to about 740 nm, a yellow index (YI) of less than or equal to about 1.0, and a haze of less than or equal to about 0.3 simultaneously while having the refractive index and the phase retardation.

The phase difference film may be utilized in various display devices.

FIG. 1 is a schematic cross-sectional view of a display device according to an embodiment.

Referring to FIG. 1, a display device 100 according to an embodiment includes a display panel 50 and a phase difference film 10.

The display panel 50 may be, for example, a liquid crystal display panel or an organic light emitting panel.

The phase difference film 10 may be disposed toward an observer side.

Figure 2:
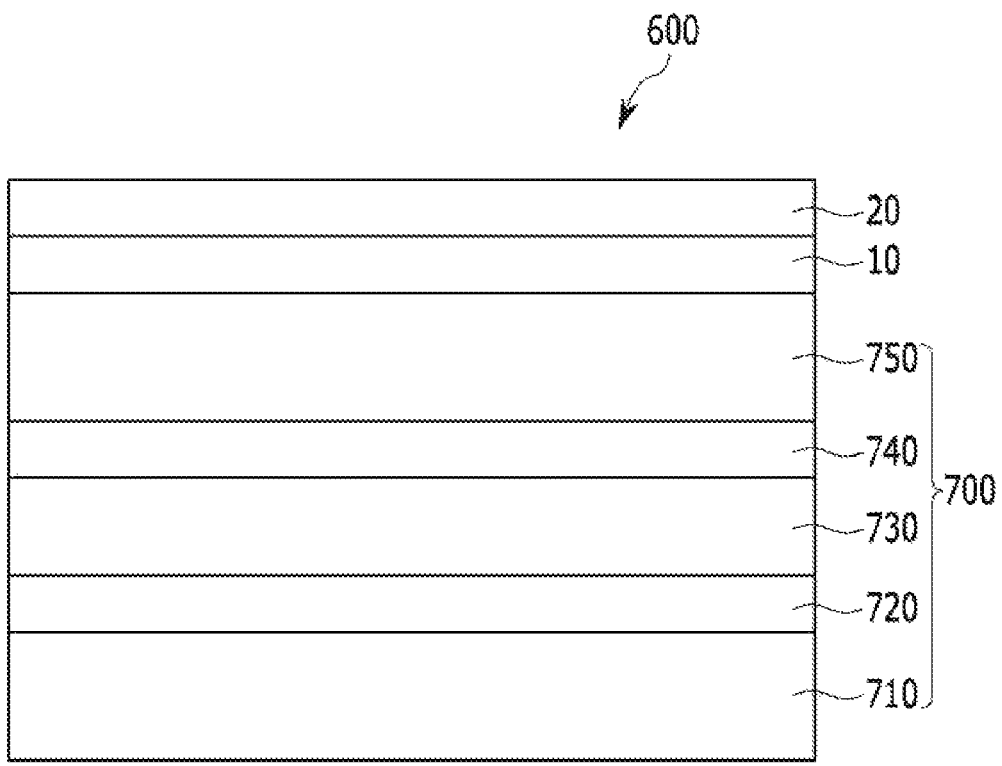
FIG. 2 is a schematic cross-sectional view of a display device according to another embodiment.

FIG. 2 is a schematic cross-sectional view of a display device according to an embodiment.

Referring to FIG. 2, an organic light emitting diode device 600 according to an embodiment includes an organic light emitting panel 700 and a phase difference film 10 disposed on a surface of the organic light emitting panel 700.

The organic light emitting panel 700 may include a base substrate 710, a lower electrode 720, an organic emission layer 730, an upper electrode 740, and an encapsulation substrate 750.

The base substrate 710 may be made of glass or plastic.

At least one of the lower electrode 720 and upper electrode 740 may be an anode, and the other one may be a cathode. The anode is an electrode into which holes are injected, which may be made of a conductive material having a high work function, and the cathode is an electrode into which electrons are injected, which may be made of a conductive material having a low work function. At least one of the lower electrode 720 and the upper electrode 740 may be made of a transparent conductive material from which emitted light exits outside, for example, ITO or IZO.

The organic emission layer 730 includes an organic material which may emit light when a voltage is applied to the lower electrode 720 and the upper electrode 740.

An auxiliary layer (not shown) may be further provided between the lower electrode 720 and the organic emission layer 730 and between the upper electrode 740 and the organic emission layer 730. The auxiliary layer may include a hole transporting layer, a hole injecting layer, an electron injecting layer, and an electron transporting layer in order to balance electrons and holes, but is not limited thereto.

The encapsulation substrate 750 may be made of glass, metal, or a polymer, and may seal the lower electrode 720, the organic emission layer 730, and the upper electrode 740 to prevent moisture and/or oxygen inflow from the outside.

The phase difference film 10 may be the same as described above, and may be disposed at a light emitting side. For example, in the case of a bottom emission structure emitting light at the side of the base substrate 710, the phase difference film 10 may be disposed on the exterior side of the base substrate 710, while on the other hand, in the case of a top emission structure emitting light at the side of the encapsulation substrate 750, the phase difference film 10 may be disposed on the exterior side of the encapsulation substrate 750.

A polarizer 20 may be further included under the phase difference film 10.

The polarizer 20 may directly face and contact the phase difference film 10 or may be bonded by an adhesive or a tackifier.

The polarizer 20 may be made of, for example, elongated polyvinyl alcohol (PVA) according to a method of, for example, drawing a polyvinyl alcohol film, adsorbing iodine or a dichroic dye thereto, and treating it with boric acid and washing the same.

The polarizer 20 may be, for example, a polarizing film prepared by melt-blending a polymer resin and a dichroic dye, and the polarizing film may be, for example, made by mixing a polymer and a dye and melting the mixture at a temperature above the melting point of the polymer resin to manufacture it in a form of a sheet. The polymer resin may be a hydrophobic polymer resin and may be, for example, polyolefin.

The polarizer 20 may linearly polarize incident light and the compensation film 10 may circularly polarize linearly polarized light that passes through the polarizer 20.

Figure 3:
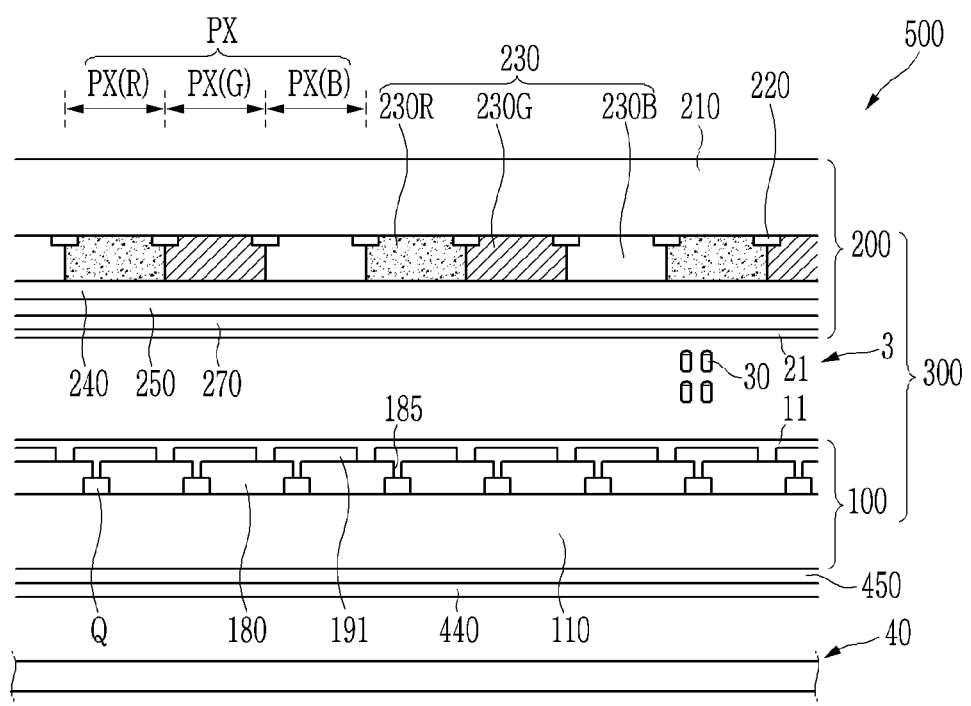
FIG. 3 is a schematic cross-sectional view of a display device according to yet another embodiment.

FIG. 3 is a schematic cross-sectional view of a display device according to another embodiment.

Referring to FIG. 3, a liquid crystal display 500 according to an embodiment includes a light source 40 and a liquid crystal display panel 300.

The light source 40 may be a planar light source, a dot light source, or a line light source that supplies light with the liquid crystal display panel 300, and may be, for example, disposed in form of an edge-type or a direct type. The light source 40 may include a light emitting region including a light emitting element, a reflector disposed under the light emitting region and reflecting light emitted from the light emitting region, a light guide that supplies the light emitted from the light emitting region toward a liquid crystal display panel and/or at least one optical sheet disposed on the light guide, but is not limited thereto.

The light emitting element may be, for example, a fluorescent lamp or a light emitting diode (LED), and for example, may supply light in a visible ray region (hereinafter, referred to as 'visible light'), for example, blue light having high energy.

The liquid crystal display panel 300 includes a lower display panel 100 disposed on the side of the light source 40, an upper display panel 200 facing the lower display panel 100, and a liquid crystal layer 3 disposed between the lower display panel 100 and the upper display panel 200.

The lower display panel 100 includes a lower substrate 110, a plurality of wires (not shown), a thin film transistor Q, a pixel electrode 191, and an alignment layer 11.

The lower substrate 110 may be, for example, an insulation substrate such as a glass substrate or a polymer substrate, and the polymer substrate may be made of, for example, polyethylene terephthalate, polyethylene naphthalate, polycarbonate, polyacrylate, polyimide, or a combination thereof, but is not limited thereto.

A plurality of gate lines (not shown) that supplies a gate signal and a plurality of data line (not shown) that supplies a data signal may be formed while crossing each other on the lower substrate 110, and a plurality of pixels PX may be arranged in a form of a matrix defined by the gate lines and the data lines.

A plurality of thin film transistors Q are formed on the lower substrate 110. The thin film transistors Q may include a gate electrode (not shown) connected to the gate lines, a semiconductor (not shown) overlapping with the gate electrode, a gate insulating layer (not shown) disposed between the gate electrode and the semiconductor, a source electrode (not shown) connected to the data lines, and a source electrode and a drain electrode (not shown) facing the same in the center of the semiconductor. In FIG. 3, each pixel PX includes one thin film transistor Q, but is not limited thereto, and two or more thin film transistors may be disposed.

A protective layer 180 is formed on the thin film transistors Q, and the protective layer 180 has a contact hole 185 exposing the thin film transistors Q.

A pixel electrode 191 is formed on the protective layer 180. The pixel electrode 191 may be made of a transparent conductor such as ITO or IZO, and is electrically connected to the thin film transistor Q through the contact hole 185. The pixel electrode 191 may have a predetermined pattern.

An alignment layer 11 is formed on the pixel electrode 191.

The upper display panel 200 includes an upper substrate 210, a color conversion layer 230, an in-cell polarizing layer 240, an in-cell phase difference thin film 250, a common electrode 270, and an alignment layer 21.

The upper substrate 210 may be, for example, an insulation substrate such as a glass substrate or a polymer substrate, and the polymer substrate may be made of, for example, polyethylene terephthalate, polyethylene naphthalate, polycarbonate, polyacrylate, polyimide, or a combination thereof, but is not limited thereto.

A light blocking member 220 that is referred to as a black matrix is formed on one surface of the upper substrate 210. The light blocking member 220 may block light leakage between the pixel electrodes 191.

In addition, a color conversion layer 230 is formed on one surface of the upper substrate 210. The color conversion layer 230 is supplied with light in a predetermined wavelength region and emits the same light or light in a different wavelength region to display colors. The color conversion layer 230 includes a photoluminescence material that is stimulated by light and emits light by itself, that is a light emitting element. The light emitting element may be, for example, at least one of a quantum dot and a phosphor.

For example, the light emitting element may emit light in the same wavelength region supplied from the light source 40 or light in a longer wavelength region. For example, when the light source 40 supplies blue light, the light emitting element may emit blue light in the same wavelength region or emit light in a longer wavelength region than blue light, for example, red light or green light.

In this way, high photoconversion efficiency and low power consumption may be realized by including the color conversion layer 230 including a light emitting element. In addition, the color conversion layer 230 including the light emitting element may much reduce a light loss according to the absorption, and thus, increase photoefficiency compared with a conventional color filter including a dye and/or a pigment, and thus, absorbing a considerable dose of light emitted from the light source 40 and showing low photoefficiency. In addition, color purity may be increased by an inherent luminous color of the light emitting element. Furthermore, the light emitting element emits light scattering in all directions and may improve viewing angle characteristics.

FIG. 3 shows a red conversion layer 230R including a red light emitting element emitting red light, a green conversion layer 230G including a green light emitting element emitting green light, and a blue conversion layer 230B including a blue light emitting element emitting blue light, but the present invention is not limited thereto. For example, the red conversion layer 230R may emit light in a wavelength region ranging from greater than about 590 nm to less than or equal to about 700 nm, the green conversion layer 230G may emit light in a wavelength region ranging from about 510 nm to about 590 nm, and the blue conversion layer 230B may emit light in a wavelength region ranging from greater than or equal to about 380 nm to less than about 510 nm. For example, the light emitting element may be a light emitting element emitting cyan light, a light emitting element emitting magenta light, and/or a light emitting element emitting yellow light or additionally include these light emitting elements. For example, when the light source 40 supplies blue light, the blue conversion layer 230B passes the light supplied from the light source 40 without a separate light emitting element as it is, and thus, display blue, and herein, the blue conversion layer 230B may be empty or may include a transparent insulator.

The light emitting element may be, for example, at least one of a phosphor and a quantum dot.

For example, the red conversion layer 230R may include a red phosphor, for example, one or more selected from $Y_2O_2S:Eu$, $YVO_4:Eu,Bi$, $Y_2O_2S:Eu,Bi$, $SrS:Eu$, $(Ca, Sr)S:Eu$, $SrY_2S_4:Eu$, $CaLa_2S_4:Ce$, $(Sr,Ca,Ba)_3SiO_5:Eu$, $(Sr,Ca,Ba)_2Si_5N_8:Eu$, and $(Ca,Sr)_2AlSiN_3:Eu$. For example, the green conversion layer 230G may include a green phosphor, for example, one or more selected from $YBO_3:Ce,Tb$, $BaMgAl_{10}O_{17}:Eu,Mn$, $(Sr,Ca,Ba)(Al,Ga)_2S_4:Eu$, $ZnS:Cu,Al$ $Ca_8Mg\ SiO_{44}Cl_2:Eu,Mn$, $Ba_2SiO_4:Eu$, $(Ba,Sr)_2SiO_4:Eu$, $Ba_2(Mg,Zn)Si_2O_7:Eu$, $(Ba,Sr)Al_2O_4:Eu$, $Sr_2Si_3O_8.2SrCl_2:Eu$, $(Sr,Ca, Ba, Mg)P_2O_7N_8:Eu, Mn$, $(Sr,Ca, Ba, Mg)_3P_2O_8:Eu, Mn$, $Ca_3Sc_2Si_3O_{12}:Ce$, $CaSc_2O_4:Ce$, $b-SiAlON:Eu$, $Ln_2Si_3O_3N_4:Tb$, and $(Sr,Ca,Ba)Si_2O_2N_2:Eu$.

For example, the red conversion layer 230 may include a quantum dot. The quantum dot may be any semiconductor nanocrystal known in the art, and may have various shapes, for example, an isotropic semiconductor nanocrystal, a quantum rod, and a quantum plate. Herein, the quantum rod may indicate a quantum dot having an aspect ratio of greater than about 1, for example, an aspect ratio of greater than or equal to about 2, greater than or equal to about 3, or greater than or equal to about 5. For example, the quantum rod may have an aspect ratio of less than or equal to about 50, of less than or equal to about 30, or of less than or equal to about 20. The quantum dot may have, for example, a particle diameter (an average largest particle diameter for a non-spherical shape) of about 1 nm to about 100 nm, for example, about 1 nm to about 80 nm, for example, about 1 nm to about 50 nm, for example, about 1 nm to about 20 nm.

The quantum dot may control a light emitting wavelength by changing a size and/or a composition. For example, the quantum dot may include a Group II-VII compound, a Group III-V compound, a Group IV-VI compound, a Group IV compound, or a combination thereof. The Group II-VI compound may be, for example, a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. The Group IV compound may include a single-element compound selected from Si, Ge, and a mixture thereof; and a binary element compound selected from SiC, SiGe, and a mixture thereof.

The quantum dot may include the binary element compound, the ternary element compound, or the quaternary element compound in a substantially uniform concentration or partially different concentration distributions. The quantum dot may have a core-shell structure wherein one quantum dot surrounds another quantum dot. For example, the core and the shell of the quantum dot may have an interface, and an element of at least one of the core or the shell in the interface may have a concentration gradient wherein the concentration of the element(s) of the shell decreases toward the core. For example, a material composition of the shell of the quantum dot has a higher energy bandgap than a material composition of the core of the quantum dot, and thereby the quantum dot may exhibit a quantum confinement effect. The quantum dot may have one core of a quantum dot and multi-shells surrounding the core. The multi-shell structure has at least two shells wherein each shell may be a single composition, an alloy, or the one having a concentration gradient. For example, a shell of a multi-shell that is far from the core may have a higher energy bandgap than a shell that is near to the core, and thereby the quantum dot may exhibit a quantum confinement effect.

The quantum dot may have a quantum yield of greater than or equal to about 10%, for example, greater than or equal to about 30%, greater than or equal to about 50%, greater than or equal to about 60%, greater than or equal to about 70%, or greater than or equal to about 90%, but is not limited thereto.

The quantum dot has a relatively narrower spectrum. For example, the quantum dot may have a full width at half maximum (FWHM) of a light emitting wavelength spectrum of less than or equal to about 45 nm, for example, less than or equal to about 40 nm, or less than or equal to about 30 nm. The quantum dot may be included in the color conversion layer 230 in a form of a quantum dot-polymer composite wherein the quantum dot is dispersed in the polymer. The polymer may act as a matrix of the quantum dot-polymer composite, and the quantum dot is not particularly limited if it does not quench the quantum dot. The polymer may be a transparent polymer, for example, polyvinylpyrrolidone, polystyrene, polyethylene, polypropylene, poly(methyl) acrylate, polymethylmethacrylate, polybutylmethacrylate (PBMA), a copolymer thereof, or a combination thereof, but is not limited thereto. The quantum dot-polymer composite may have one layer or a multi-layer.

The in-cell polarizing layer 240 is disposed on one surface of the color conversion layer 230.

The in-cell polarizing layer 240 may be a polarization layer inside the liquid crystal display panel 300 and may be disposed on a lower whole surface of the color conversion layer 230. The in-cell polarizing layer 240 may be disposed under the color conversion layer 230 and supply polarized light with the color conversion layer 230.

In this way, since the in-cell polarizing layer 240 is disposed beneath the color conversion layer 230, but a separate polarizing plate attached outside of the liquid crystal display panel 300 is not disposed, the light emitted from the light emitting element of the color conversion layer 230 receives no influence by the polarizing plate outside of the liquid crystal display panel 300, and as a result, a contrast ratio may be improved. Specifically, the light emitting element of the color conversion layer 230 emits scattered light that polarizing light is broken, and accordingly, when a polarizing plate is disposed on the color conversion layer 230, that is, where the scattered light passes, black luminance may be much increased, and thus, a contrast ratio may be lowered. In addition, an effect of improving a viewing angle of a liquid crystal display (LCD) may not be hindered by the scattered light emitted from the light emitting element of the color conversion layer 230, but may be maintained.

Accordingly, discoloring or image distortion due to an influence of a polarizing plate attached outside of a liquid crystal display panel on light emitted from the light emitting element may be prevented by using the in-cell polarizing layer 240, inherent photoluminescence characteristics of the light emitting element may be maintained, and thus, high color purity may be secured and a light loss may be reduced. In addition, the in-cell polarizing layer is a less than or equal to about 1 μm-thick thin film, and thus, may reduce a thickness of a liquid crystal display.

The in-cell polarizing layer 240 may be a linear polarizer that converts light emitted from the light source 40 and passing through the liquid crystal layer 3 into linear polarized light.

For example, the in-cell polarizing layer 240 may be made of, for example, elongated polyvinyl alcohol (PVA) according to a method of, for example, elongating a polyvinyl alcohol film, adsorbing iodine or a dichroic dye thereto, and borating and washing the same.

For example, the in-cell polarizing layer 240 may be a polarizing film prepared, for example, by mixing a polymer and a dichroic dye and melt blending the polymer with the dichroic dye to melt them at a temperature above the melting point of the polymer. The polymer may be a hydrophobic polymer, for example, polyolefin.

For example, the in-cell polarizing layer 240 may be a wire grid polarizer. The wire grid polarizer has a structure that a plurality of metal wire is aligned in one direction, and accordingly, when incident light passes the wire grid polarizer, the light parallel to a metal wire is absorbed or reflected, but the light perpendicular therewith is transmitted and may form linear polarized light. Herein, the linear polarized light may be more efficiently formed when a wavelength of light is wider than a gap between the metal wires. The wire grid polarizer may be appropriately applied as the in-cell polarizing layer, wherein the in-cell polarizing layer is thin, and thus, may realize a thin liquid crystal display 500.

The in-cell phase difference thin film 250 is formed on one surface of the in-cell polarizing layer 240.

The in-cell phase difference thin film 250 may be inside the liquid crystal display panel 300, and for example, in-cell phase difference thin film 250 may contact the in-cell polarizing layer 240. For example, the in-cell phase difference thin film 250 may be spaced apart from the in-cell polarizing layer 240 by disposing another layer therebetween, for example, an insulation layer such as silicon oxide and nitrogen oxide.

The in-cell phase difference thin film 250 may be the same as the phase difference film including the phase difference thin film.

The in-cell phase difference thin film 250 may be a coating-type phase difference thin film coated through a solution process as described above, and the coating-type phase difference thin film may be a non-elongated thin film. For example, a predetermined phase difference may be applied to the in-cell phase difference thin film 250 by inducing a linear alignment or a planar alignment of non-liquid crystal polymers in a step of preparing a mixture of at least two non-liquid crystal polymers as a solution and then, coating and drying it.

The in-cell phase difference thin film 250 may have a low thickness of less than or equal to about 5 µm, for example, less than or equal to about 4.5 µm, less than or equal to about 4.2 µm, less than or equal to about 4.0 µm, less than or equal to about 3.8 µm, less than or equal to about 3.5 µm, less than or equal to about 3.3 µm, less than or equal to about 3.2 µm, or less than or equal to about 3.0 µm.

The in-cell phase difference thin film 250 may have a thickness direction phase difference per unit thickness of greater than or equal to about 80 nm/µm. The in-cell phase difference thin film 250 may have a thickness direction phase difference per unit thickness of about 80 nm/µm to 300 nm/µm, for example, about 80 nm/µm to 250 nm/µm, about 80 nm/µm to 230 nm/µm, about 80 nm/µm to 220 nm/µm, about 80 nm/µm to 200 nm/µm, about 80 nm/µm to 180 nm/µm, about 80 nm/µm to 150 nm/µm, or about 80 nm/µm to 120 nm/µm. The in-cell phase difference thin film 250 is a thickness direction phase difference per unit thickness within the ranges, and thus, may perform an effective compensation function.

As described above, the in-cell phase difference thin film 250 may have a refractive index of $n_x \leq n_y > n_z$, for example, a refractive index of $n_x = n_y > n_z$.

As described above, the in-cell phase difference thin film 250 may include at least two non-liquid crystal polymers, and a combination thereof may satisfy the above optical properties.

For example, the in-cell phase difference thin film 250 may include two non-liquid crystal polymers, and one of the two non-liquid crystal polymers may be a polyamideimide.

For example, the in-cell phase difference thin film 250 may include two non-liquid crystal polymers, and one of the two non-liquid crystal polymers may be a polyimide.

For example, the in-cell phase difference thin film 250 two non-liquid crystal polymers, and one of the two non-liquid crystal polymers may be a polyimide and the other may be a polyamideimide.

For example, the in-cell phase difference thin film 250 may include a mixture of polyimide and polyamideimide. The polyimide and the polyamideimide may be the same as described above.

For example, the polyamideimide may be included in the same amount as or greater amount than the polyamide. For example, the polyamideimide may be included in an amount of about 50 wt % to about 75 wt %, for example, about 55 wt % to about 75 wt %, for example, about 60 wt % to about 75 wt %, or about 65 wt % to about 75 wt %, based on a total amount of the polyimide and the polyamideimide. While not wishing to be bound by any particular theory, it is understood that, when the polyamideimide is included within the above ranges, a phase difference film having sufficient transmittance characteristics as well as the refractive index and phase retardation may be realized.

For example, the in-cell phase difference thin film 250 may simultaneously satisfy greater than or equal to about 88% of average light transmittance in a wavelength region of about 360 nm to about 740 nm, about a yellow index (YI) of less than or equal to about 1.0, and a haze of less than or equal to about 0.3 as well as have the above refractive index and phase retardation.

The in-cell phase difference thin film 250 has the above refractive index and phase retardation, and accordingly, may decrease or prevent a light leakage at a side, before light reaches the color conversion layer 230 in a black mode, and thus, decrease black luminance by reducing unnecessary light emission of the color conversion layer 230 in the black mode and improve a contrast ratio.

The common electrode 270 is formed on one surface of the in-cell phase difference thin film 250. The common electrode 270 may be, for example, made of a transparent conductor such as ITO or IZO and formed on the whole surface of the in-cell phase difference thin film 250. The common electrode 270 has a predetermined pattern.

The alignment layer 21 is coated on one surface of the common electrode 270.

The liquid crystal layer 3 including a plurality of liquid crystals 30 is disposed between the lower display panel 100 and the upper display panel 200. The liquid crystal 30 may have positive or negative dielectric anisotropy. For example, the liquid crystal 30 may have negative dielectric anisotropy. For example, the liquid crystal 30 may be aligned in a substantially vertical direction to the surfaces of the substrates 110 and 210, when an electric field is not applied to the pixel electrode 191 and the common electrode 270. Thereby the liquid crystal display 500 may realize a vertical alignment liquid crystal display.

A lower polarization layer 440 and a lower phase difference film 450 may be further included under the liquid crystal display panel 300.

The lower polarizing layer 440 is attached to the outside of the lower display panel 100. The lower polarizing layer 440 may be a linear polarizer, which polarizes light supplied from the light source 40 and supplies polarized light with the liquid crystal layer 3.

For example, the lower polarizing layer 440 may be made of, for example, elongated polyvinyl alcohol (PVA) according to a method of, for example, elongating a polyvinyl alcohol film, adsorbing iodine or a dichroic dye thereto, and treating it with a borate and washing the same.

For example, the lower polarizing layer 440 may be a polarizing film prepared, for example, by mixing a polymer and a dichroic dye and melt blending the polymer with the dichroic dye to melt them at a temperature above the melting point of the polymer. The polymer may be a hydrophobic polymer, for example, polyolefin.

For example, the lower polarizing layer 240 may be a wire grid polarizer. The wire grid polarizer is combined with the in-cell polarizing layer 240 to realize a thin liquid crystal display (LCD) 500.

The lower phase difference film 450 may be attached to the outside of the lower display panel 100 and may be disposed between the lower display panel 100 and the lower polarization layer 440. The lower phase difference film 450 may be one layer or two layers and more.

As described above, the in-cell phase difference thin film 250 is a coating-type phase difference thin film having a low thickness of less than or equal to about 5 μm, a refractive index of $n_x \le n_y > n_z$, and has a thickness direction phase difference per unit thickness of greater than or equal to about 70 nm/μm, and thus, decrease or prevent a light leakage at a side, before light reaches the color conversion layer 230 in a black mode, and accordingly, reduce an unnecessary light emission of the color conversion layer 230 in the black mode, and thus, decrease black luminance and as a result, improve a contrast ratio.

According to the embodiment, a liquid crystal display (LCD) displays a color by using a color conversion layer including a light emitting material, and thus, may increase photoefficiency and improve color characteristics. In addition, photo characteristics and color characteristics may be prevented from degenerating the in-cell polarizing layer and the in-cell phase difference thin film introduced into the liquid crystal display panel by omitting a polarizer and a phase difference film outside of an upper substrate, and in addition, display characteristics may be improved by securing the photo characteristics and the viewing angle characteristics due to the color conversion layer including a light emitting material. In addition, the in-cell polarizing layer and the in-cell phase difference thin film have a low thickness, and thus, may realize a thin liquid crystal display.

Hereinafter, the embodiments are illustrated in more detail with reference to examples. However, these examples are exemplary, and the present disclosure is not limited thereto.

SYNTHESIS EXAMPLES

Synthesis Example 1: Synthesis of Polyimide

A reactor equipped with a temperature controller is maintained at 25° C. while nitrogen is allowed to flow in the reactor. 1,600 g of dimethylacetylamide (DMAc) and 174 g of 2,2'-bis(trifluoromethyl)benzidine (TFDB) are placed in the reactor and stirred for 1 hour to prepare a diamine solution. 32 g of biphenyl dianhydride (BPDA) and 194 g of 4,4'-(hexafluoroisopropylidene)diphthalic anhydride (6FDA) are added to the diamine solution, and the obtained mixture is stirred at 25° C. for 48 hours to obtain a polyamic acid solution. 167 g of acetic anhydride is added to the polyamic acid solution, and the obtained mixture is stirred for 30 minutes. Subsequently, 129 g of pyridine is added thereto, and the obtained mixture is stirred for 24 hours to obtain a composition including an imidized polymer.

The composition in a solution state is precipitated by using 8 L of water, and a solid precipitated therein is filtered and ground, additionally washed, filtered and ground again, and dried in a 100° C. vacuum oven to obtain a polyimide (Mw: about 130,000 Da) solid powder.

Synthesis Example 2: Synthesis of Polyamideimide

A reactor equipped with a temperature controller is maintained at 25° C., while nitrogen is allowed to flow in the reactor. 1,600 g of dimethylacetylamide (DMAc) and 223 g of 2,2'-bis(trifluoromethyl)benzidine (TFDB) are placed in the reactor and stirred for 1 hour to prepare a diamine solution. 30 g of biphenyl dianhydride (BPDA) and 46 g of 4,4'-(hexafluoroisopropylidene)diphthalic anhydride (6FDA) are added to the diamine solution, and the obtained mixture is stirred at 25° C. for 3 hours to obtain a polyamic acid solution. The reactor containing the polyamic acid solution is cooled down to 10° C., 99 g of p-terephthaloyl chloride (TPCl) is added thereto, and the obtained mixture is stirred for 24 hours to obtain a poly(amic acid-amide) block copolymer. 213 g of acetic anhydride is added to the poly(amic acid-imide) solution, and the obtained mixture is stirred for 30 minutes. Subsequently, 165 g of pyridine is added thereto, and the obtained mixture is stirred for 24 hours to obtain a composition including an imidized polymer.

The composition in a solution state is precipitated by using 8 L of water, and a solid precipitated therein is filtered and ground, additionally washed, filtered and ground again, and dried in a 100° C. vacuum oven to obtain a polyamideimide (Mw: about 180,000 Da) solid powder.

Synthesis Example 3: Synthesis of Polyamideimide

A reactor equipped with a temperature controller is maintained at 25° C., while nitrogen is allowed to flow in the reactor. 1,280 g of dimethylacetylamide (DMAc) and 185 g of 2,2'-bis(trifluoromethyl)benzidine (TFDB) are placed in the reactor, and the mixture is stirred for one hour to prepare a diamine solution. 26 g of biphenyl dianhydride (BPDA), 40 g of 4,4'-(hexafluoroisopropylidene) diphthalic anhydride (6FDA), and 4.6 g of phthalic anhydride as an end-capping agent are added to the diamine solution, and the obtained mixture is stirred at 25° C. for 3 hours to prepare a polyamic acid solution. 80 g of p-terephthaloyl chloride (TPCl) is added to the polyamic acid solution, and the obtained mixture is stirred for 24 hours to obtain a poly(amic acid-amide) block copolymer. 170 g of acetic anhydride is added to the poly(amic acid-imide) solution, and the obtained mixture is stirred for 30 minutes. Subsequently, 130 g of pyridine is added thereto, and the obtained mixture is stirred for 24 hours to obtain a composition including an imidized polymer.

The composition in a solution state is precipitated by using 8 L of water, and the precipitated solid therein is filtered and ground, additionally washed, filtered and ground again, and dried in a 100° C. vacuum oven to obtain a polyamideimide (Mw: about 97,000 Da) solid powder.

Preparation Example: Manufacture of Phase Difference Film

A polymer solution is prepared by mixing the polyimide (PI) according to Synthesis Example 1 and the polyamideimide (PAI) according to Synthesis Example 2 or 3 in a ratio shown in Table 1. Viscosity of the polymer solution is shown in Table 1.

Subsequently, the polymer solution is spin-coated on a glass substrate and dried at 80° C. for a predetermined time, and a film from which a solvent disappears to a degree is additionally processed in a 180° C. furnace to obtain a phase difference film.

TABLE 1

|  | Synthesis Example No. | | PI:PAI | Viscosity | Thickness |
|  | PI | PAI | (wt/wt) | (cps) | (d, µm) |
| --- | --- | --- | --- | --- | --- |
| Preparation Example 1 | 1 | 2 | 50:50 | 92 | 1.28 |
| Preparation Example 2 | 1 | 2 | 40:60 | 130 | 1.09 |
| Preparation Example 3 | 1 | 2 | 33:67 | 170 | 1.13 |
| Preparation Example 4 | 1 | 2 | 25:75 | 220 | 1.07 |
| Preparation Example 5 | 1 | 3 | 33:67 | 15.78 | 1.09 |
| Comparative Preparation Example 1 | 1 | 2 | 100:0 | 12 | 2.14 |
| Comparative Preparation Example 2 | 1 | 2 | 86:14 | 23 | 1.04 |
| Comparative Preparation Example 3 | 1 | 2 | 80:20 | 31 | 1.13 |
| Comparative Preparation Example 4 | 1 | 2 | 67:33 | 53 | 1.48 |
| Comparative Preparation Example 5 | 1 | 2 | 0:100 | 542 | 3.10 |
| Comparative Preparation Example 6 | 1 | 3 | 100:0 | 12.14 | 2.14 |

Evaluation I

Refractive index characteristics, a thickness direction phase difference per a unit thickness, light transmittance, a yellow index, and a haze of the phase difference films according to Preparation Examples and Comparative Preparation Examples are evaluated.

The thickness direction phase difference per unit thickness is measured by using an Axoscan equipment (Axometrics Inc., America), and the measurement is performed within a wavelength range of 400 nm to 700 nm.

The light transmittance is obtained by measuring average transmittance with a UV spectrophotometer (cm-3600d, Konica Minolta, Inc.) within a range of 360 nm to 740 nm.

The yellow index (YI) is measured by using a UV spectrophotometer (cm-3600d, Konica Minolta, Inc.) according to ASTM D1925.

The haze is measured by using a UV spectrophotometer (cm-3600d, Konica Minolta, Inc.) according to ASTM D1003.

The results are shown in Table 2.

TABLE 2

|  | Refractive index relationship | $R_{th}/d$ (nm/µm) | Average transmittance (%) | YI | Haze |
| --- | --- | --- | --- | --- | --- |
| Preparation Example 1 | $n_x = n_y > n_z$ | 82.93 | 88.33 | 0.80 | 0.07 |
| Preparation Example 2 | $n_x = n_y > n_z$ | 90.01 | 88.23 | 0.80 | 0.13 |
| Preparation Example 3 | $n_x = n_y > n_z$ | 90.55 | 88.20 | 0.90 | 0.15 |
| Preparation Example 4 | $n_x = n_y > n_z$ | 101.10 | 88.20 | 0.98 | 0.10 |
| Preparation Example 5 | $n_x = n_y > n_z$ | 80.76 | 88.01 | 0.87 | 0.08 |
| Comparative Preparation Example 1 | $n_x = n_y > n_z$ | 63.20 | 88.51 | 0.62 | 0.09 |
| Comparative Preparation Example 2 | $n_x = n_y > n_z$ | 66.10 | 88.51 | 0.69 | 0.10 |
| Comparative Preparation Example 3 | $n_x = n_y > n_z$ | 72.59 | 88.87 | 0.64 | 0.06 |
| Comparative Preparation Example 4 | $n_x = n_y > n_z$ | 76.00 | 88.34 | 0.75 | 0.09 |
| Comparative Preparation Example 5 | $n_x = n_y > n_z$ | 113.40 | 85.88 | 0.91 | 0.50 |
| Comparative Preparation Example 6 | $n_x = n_y > n_z$ | 63.20 | 88.51 | 0.62 | 0.09 |

Referring to Table 2, the thickness direction phase difference per unit thickness may be changed depending on a composition of the phase difference film, that is, a ratio of polyimide (PI) and polyamideimide (PAI). Specifically, the phase difference film including polyimide (PI) and polyamideimide (PAI) in a predetermined ratio may simultaneously satisfy a thickness direction phase difference per unit thickness of greater than or equal to about 80 nm/µm, average light transmittance of greater than or equal to about 88%, a yellow index (YI) of less than or equal to about 1.0, and a haze of less than or equal to about 0.3, but the phase difference film including polyamideimide (PAI) alone according to Comparative Preparation Example 5 shows much deteriorated light transmittance and an increased haze.

Optical Simulation

An optical simulation regarding liquid crystal display (LCD) having the following structure is performed to compare average black luminance of the liquid crystal display (LCD).

The optical simulation is performed by using a Techwiz program (Sanayi System Co., Ltd.), and a black luminance distribution is calculated at a wavelength of 450 nm within an azimuth range of 0° to 360° and a slope angle range of 0° to 90° and then, averaged for comparison.

Example 1

An optical simulation regarding a liquid crystal display (LCD) having a structure of disposing an upper substrate (glass); an upper polarization layer; an upper phase difference layer (each phase difference film according to Preparation Example and Comparative Preparation Example); a vertically aligned liquid crystal layer; a lower substrate (glass); a lower phase difference layer; a lower polarization layer; a blue light source in order from an examiner is performed.

A common input variable of each layer is as follows.

A refractive index of the upper and lower substrates (glass): 1.5,

A thickness of the upper and lower substrate (glass): 500 µm,

Transmittance of the upper and lower polarization layers: 42.45%,

A degree of polarization of the upper and lower polarization layers: 99.99%,

A blue light source: a light source having a short wavelength of 450 nm,

The vertically aligned liquid crystal layer: $R_{th,cell}=-567$ nm

The upper phase difference layer: $n_{x1}=n_{y1}>n_{z1}$, $n_{avg}=1.6$

A thickness (d) of the upper phase difference layer: 5 μm

The lower phase difference layer: $n_{x2}>n_{y2}=n_{z2}$, $R_{in2}=120$ nm

Examples 2 to 5

An optical simulation is performed in the same method as Example 1, except for using a liquid crystal display (LCD) respectively including the phase difference films according to Preparation Examples 2 to 5 instead of the phase difference film according to Preparation Example 1 as the upper phase difference layer.

Comparative Examples 1 to 5

An optical simulation is performed according to the same method as in Example 1, except for using a liquid crystal display (LCD) respectively including the phase difference films according to Comparative Preparation Examples 1 to 4 and 6 instead of the phase difference film according to Preparation Example 1 as the upper phase difference layer.

Evaluation II

Average black luminance of the liquid crystal displays (LCD) according to Examples and Comparative Examples is evaluated.

The average black luminance may be obtained as an average of black luminance's at all the azimuths and slope angles, and as the average black luminance is lower, a contrast ratio of the liquid crystal display (LCD) may be expected to be higher.

The results are shown in Table 3.

TABLE 3

| | $R_{th}/d$ (nm/μm) | Average black luminance (cd/m$^2$) |
|---|---|---|
| Example 1 | 82.93 | 7.4 |
| Example 2 | 90.01 | 2.0 |
| Example 3 | 90.55 | 1.7 |
| Example 4 | 101.10 | 1.1 |
| Example 5 | 80.76 | 9.7 |
| Comparative Example 1 | 63.20 | 39.0 |
| Comparative Example 2 | 66.10 | 33.1 |
| Comparative Example 3 | 72.59 | 21.3 |
| Comparative Example 4 | 76.00 | 16.0 |
| Comparative Example 5 | 63.20 | 39.0 |

Referring to Table 3, the liquid crystal displays (LCD) according to Examples shows much lower average black luminance than the liquid crystal displays (LCD) according to Comparative Examples. Accordingly, the liquid crystal displays (LCD) according to Examples may be expected to show an improved contrast ratio compared with that of the liquid crystal displays (LCD) according to Comparative Examples.

Combining Table 2 with Table 3, a thickness direction phase difference per unit thickness of a phase difference film may be changed depending on a composition of a phase difference film, that is, a ratio of polyimide (PI) and polyamideimide (PAI), and this thickness direction phase difference change per unit thickness of the phase difference film may be used to adjust average black luminance of a liquid crystal display (LCD).

While this disclosure has been described in connection with what is presently considered to be practical example embodiments, it is to be understood that the present description is not limited to the disclosed embodiments, but, on the contrary, is intended to cover various modifications and equivalent arrangements included within the spirit and scope of the appended claims.

What is claimed is:

1. A phase difference film comprising:
   a phase difference thin film comprising at least two non-liquid crystal polymers, wherein the at least two non-liquid crystal polymers comprise a polyamideimide and a polyimide, and an amount of the polyamideimide is the same as or greater than an amount of the polyimide;
   wherein the phase difference thin film satisfies refractive indexes of $n_x \geq n_y > n_z$ and has a thickness direction phase difference per unit thickness of greater than or equal to about 80 nanometers/micrometer,
   wherein $n_x$ denotes a refractive index of the phase difference thin film at a slow axis thereof, $n_y$ denotes a refractive index of the phase difference thin film at a fast axis thereof, and $n_z$ denotes a refractive index of the phase difference thin film in a direction perpendicular to the slow axis and the fast axis thereof.

2. The phase difference film of claim 1, wherein each of the non-liquid crystal polymers has a glass transition temperature of greater than or equal to about 150° C.

3. The phase difference film of claim 1, wherein an amount of the polyamideimide is about 50 percent by weight to about 75 percent by weight, based on a total amount of the polyimide and the polyamideimide.

4. The phase difference film of claim 1, wherein the refractive indexes of the phase difference thin film satisfy $n_x=n_y>n_z$.

5. The phase difference film of claim 1, wherein the thickness direction phase difference per unit thickness of the phase difference thin film ranges from about 80 nanometers/micrometer to about 120 nanometers/micrometer.

6. The phase difference film of claim 1, wherein a thickness of the phase difference thin film is less than or equal to about 5 micrometers.

7. The phase difference film of claim 1, wherein the optical film consists of the phase difference thin film, and wherein the phase difference thin film is a non-elongated thin film.

8. The phase difference film of claim 1, wherein a yellow index (YI) of the phase difference film is less than or equal to about 1.0 and a haze of the phase difference film is less than or equal to about 0.3.

9. A display device comprising the phase difference film of claim 1.

10. A liquid crystal display comprising:
    a light source and a liquid crystal display panel,
    wherein the liquid crystal display panel comprises:
    a first substrate disposed on the light source,
    a second substrate facing the first substrate,
    a liquid crystal layer disposed between the first substrate and the second substrate, and
    a phase difference thin film disposed between the second substrate and the liquid crystal layer, wherein the phase difference thin film includes at least two non-liquid crystal polymers,
    wherein the phase difference thin film satisfies refractive indexes of $n_x \geq n_y > n_z$ and a has thickness direction phase difference per unit thickness of greater than or equal to about 80 nanometers/micrometer,
    wherein $n_x$ denotes a refractive index of the phase difference thin film at a slow axis thereof, $n_y$ denotes a refractive index of the phase difference thin film at a fast axis thereof, and $n_z$ denotes a refractive index of the phase difference thin film in a direction perpendicular to the slow axis and the fast axis thereof, and wherein the phase difference thin film has an average light transmittance of greater than or equal to about 88% in a wavelength region of about 360 nanometers to about 740 nanometers.

11. The liquid crystal display of claim 10, wherein each of the non-liquid crystal polymers has a glass transition temperature of greater than or equal to about 150° C.

12. The liquid crystal display of claim 11, wherein one of the non-liquid crystal polymers is a polyamideimide.

13. The liquid crystal display of claim 12, wherein the other of the non-liquid crystal polymers is a polyimide.

14. The liquid crystal display of claim 13, wherein an amount of the polyamideimide is the same as or greater than an amount of the polyimide.

15. The liquid crystal display of claim 13, wherein an amount of the polyamideimide is about 50 percent by weight to about 75 percent by weight, based on a total amount of the polyimide and the polyamideimide.

16. The liquid crystal display of claim 10, wherein the refractive indexes of the phase difference thin film satisfy $n_x = n_y > n_z$.

17. The liquid crystal display of claim 10, wherein the thickness direction phase difference per unit thickness of the phase difference thin film ranges from about 80 nanometers/micrometer to about 120 nanometers/micrometer.

18. The liquid crystal display of claim 10, wherein a thickness of the phase difference thin film is less than or equal to about 5 micrometers.

19. The liquid crystal display of claim 10, further comprising a polarization layer disposed on one surface of the phase difference thin film between the second substrate and the liquid crystal layer.

20. The liquid crystal display of claim 10, further comprising a color conversion layer disposed on an upper surface of the phase difference thin film, wherein the color conversion layer comprises a light emitting element that is supplied with first visible light from the light source, wherein the light emitting element emits second visible light of the same wavelength as the first visible light or a longer wavelength than the first visible light.

* * * * *